United States Patent
Nilsson et al.

(10) Patent No.: US 8,742,588 B2
(45) Date of Patent: Jun. 3, 2014

(54) METHOD FOR MAKING VIA INTERCONNECTION

(75) Inventors: Peter Nilsson, Solna (SE); Jürgen Leib, Singapore (SG); Robert Thorslund, Solna (SE)

(73) Assignee: ÅAC Microtec AB, Uppsala (SE)

( * ) Notice: Subject to any disclaimer, the term of this patent is extended or adjusted under 35 U.S.C. 154(b) by 0 days.

(21) Appl. No.: 13/124,003

(22) PCT Filed: Oct. 15, 2009

(86) PCT No.: PCT/SE2009/051175
§ 371 (c)(1),
(2), (4) Date: Apr. 13, 2011

(87) PCT Pub. No.: WO2010/044741
PCT Pub. Date: Apr. 22, 2010

(65) Prior Publication Data
US 2011/0201197 A1  Aug. 18, 2011

(30) Foreign Application Priority Data
Oct. 15, 2008 (SE) .................................... 0850036

(51) Int. Cl.
*H01L 29/40* (2006.01)
*H01L 21/4763* (2006.01)
*H01L 21/44* (2006.01)
*H01L 25/16* (2006.01)
*H01L 23/48* (2006.01)
*H01L 25/065* (2006.01)
*H01L 21/768* (2006.01)

(52) U.S. Cl.
CPC .............. *B81C 1/0087* (2013.01); *H01L 25/16* (2013.01); *B81B 2207/096* (2013.01); *H01L 23/481* (2013.01); *H01L 25/0657* (2013.01); *B81B 2207/07* (2013.01); *B81B 2203/0353* (2013.01); *H01L 2924/14* (2013.01); *H01L 2224/0557* (2013.01); *H01L 2225/06513* (2013.01); *H01L 2225/06541* (2013.01); *H01L 21/76898* (2013.01)

USPC .......... 257/773; 257/774; 257/775; 438/637; 438/638; 438/639; 438/640; 438/667

(58) Field of Classification Search
USPC .......... 438/631, 638, 639, 640, 667; 257/773, 257/774, 775, E23.011
See application file for complete search history.

(56) References Cited

U.S. PATENT DOCUMENTS 4,118,523 A * 10/1978 Bingham et al. .............. 438/667
5,438,212 A    8/1995 Okaniwa
(Continued)

FOREIGN PATENT DOCUMENTS

EP       1 564 810 A1    8/2005
EP      1701379 (A2)     9/2006
(Continued)

OTHER PUBLICATIONS

Japanese Office Action, Jan. 21, 2014 12 pages.

*Primary Examiner* — Kevin Parendo
(74) *Attorney, Agent, or Firm* — Foley & Lardner LLP

(57) ABSTRACT

The present invention provides a method of forming a via hole (9), or a via (7), from a lower side (5) of a substrate (3) for electronic devices towards an upper side (4) of a substrate (3) at least partly through the substrate (3). The method comprises the steps of: etching a first lengthwise portion (11) of the via hole (9) and etching a second lengthwise portion (12) of the via hole (9); whereby the first lengthwise portion (11) and the second lengthwise portion (12) substantially form the via hole (9) and a constriction (23) is formed in the via hole (9). The constriction (23) defines an aperture (24) of the via hole (9) and the method further comprises the step of opening the via hole (9) by etching, with the constriction (23) functioning as an etch mask. A via is formed by at least partly filling the via hole with conductive material. A substrate for electronic devices comprising a via is also provided.

17 Claims, 6 Drawing Sheets

(56) References Cited

U.S. PATENT DOCUMENTS

| | | | |
|---|---|---|---|
| 6,107,209 A * | 8/2000 | Ohkuma | 438/733 |
| 7,485,967 B2 | 2/2009 | Kameyama et al. | |
| 2004/0016942 A1 | 1/2004 | Miyazawa et al. | |
| 2004/0061238 A1* | 4/2004 | Sekine | 257/774 |
| 2004/0092099 A1* | 5/2004 | Hanaoka et al. | 438/667 |
| 2005/0073040 A1 | 4/2005 | Lee et al. | |
| 2005/0215054 A1* | 9/2005 | Rasmussen et al. | 438/667 |
| 2006/0046463 A1* | 3/2006 | Watkins et al. | 438/622 |
| 2007/0037379 A1 | 2/2007 | Enquist et al. | |
| 2007/0052067 A1 | 3/2007 | Umemoto | |
| 2007/0155174 A1* | 7/2007 | Taniguchi et al. | 438/667 |
| 2007/0267754 A1* | 11/2007 | Kirby et al. | 257/774 |
| 2009/0001396 A1* | 1/2009 | Higaki et al. | 257/98 |
| 2009/0124078 A1 | 5/2009 | Kameyama et al. | |
| 2009/0283819 A1* | 11/2009 | Ishikawa et al. | 257/324 |

FOREIGN PATENT DOCUMENTS

| | | |
|---|---|---|
| JP | 3-102839 A | 4/1991 |
| JP | 4-82222 A | 3/1992 |
| JP | 2003-78127 A | 3/2003 |
| JP | 2004-128063 A | 4/2004 |
| JP | 2004-165602 A | 6/2004 |
| JP | 2005-235858 | 9/2005 |
| JP | 2005-353997 A | 12/2005 |
| JP | 2007-005401 A | 1/2007 |
| JP | 2007-242693 | 9/2007 |
| JP | 2007-294821 A | 11/2007 |
| JP | 2008-91628 A | 4/2008 |
| WO | WO 2009/005462 (A1) | 1/2009 |

* cited by examiner

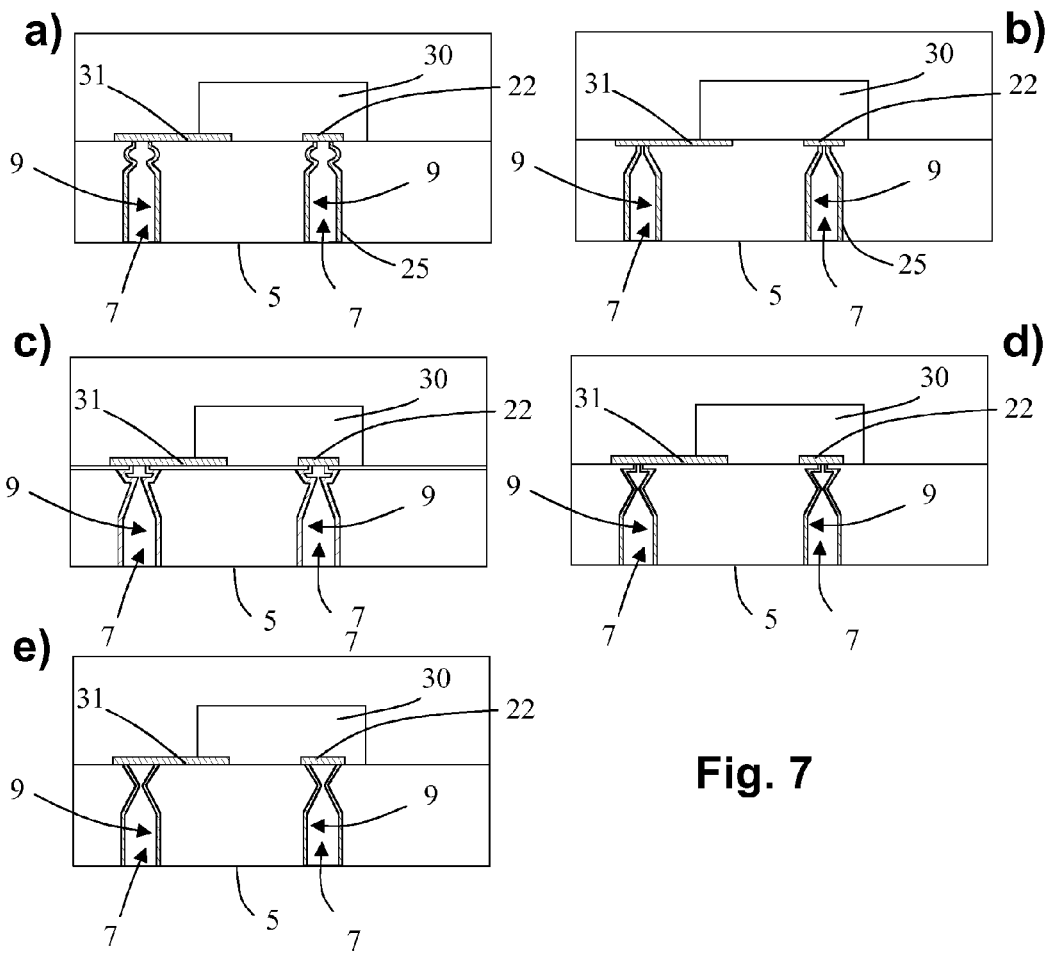
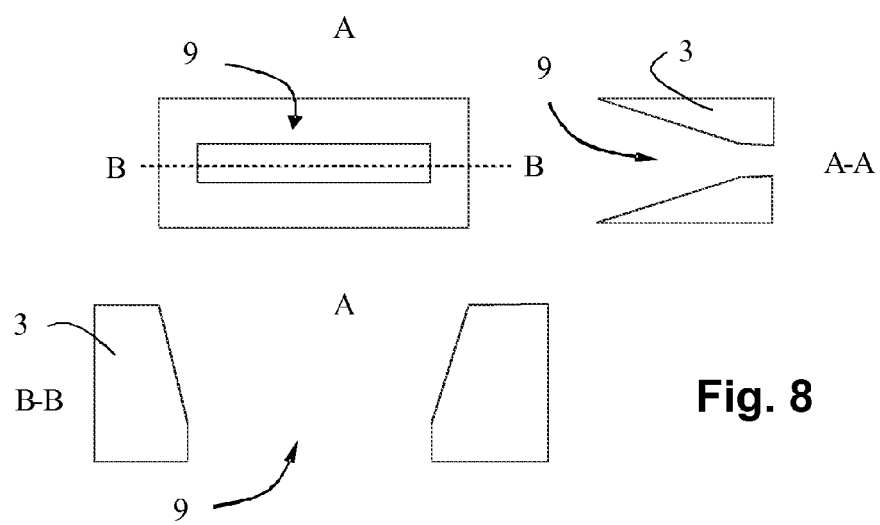
Fig. 7
Fig. 8

METHOD FOR MAKING VIA INTERCONNECTION

TECHNICAL FIELD OF THE INVENTION

The present invention relates to methods for manufacturing substrates comprising electrical via interconnections from one side of the substrate to the other.

BACKGROUND OF THE INVENTION

In the fields of microelectronics and the microelectromechanical systems (MEMS) the rapid development towards further and further miniaturized devices and higher degree of functionality is limited by packaging and interconnecting capabilities.

A substrate manufactured by the method of the present invention is typically intended for microelectronic devices, electronic MEMS devices, electronic nanotechnology devices, as well as simpler electronic devices. A microelectronic device may comprise microelectronic components such as integrated circuits integrated in, or arranged on, the surface of the substrate. A MEMS device may be formed by micromachining of e.g. a semiconductor substrate or surface micromachining on a substrate.

A fundamental building block in these technology fields is substrates, often referred to as wafers, which typically are made of silicon or other semiconductor materials. Electronic components are formed on, integrated in, or mounted on the surface of such substrates. In addition MEMS components may be formed by micromachining of e.g. a semiconductor substrate or surface micromachining on a substrate. The substrates may be of homogenous material or having different layers and/or regions of different and/or doped material. Typically the substrates are provided with pads and routings for interconnection and mounting. Accompanying the rapid development towards further and further miniaturized devices and higher degree of functionality there is an increasing interest in making electrical via interconnects between opposite sides of a wafer. Hereinafter the electrical via interconnections are interchangeably referred to as via interconnections or simply vias. Using these vias, the conventionally used unreliable, and costly, wire bonding is avoided and components can be more densely packaged.

Numerous via processes and designs have been presented. The strategy for making the vias can be divided into two categories. In the first category the vias are formed by the wafer material, e.g. a doped semiconductor via. In the second category a via hole is formed in the wafer using for example laser ablation, drilling, wet etching or dry etching. Thereafter a conductive material is deposited, e.g. using a physical vapour deposition (PVD) process, on at least the sidewalls of the via hole. To increase the cross sectional area of the via (in order to reduce the electrical resistance) a metal or metal alloy is commonly plated onto the conductive coating. Vias of the first category generally have a relatively high resistance as compared to vias of the second category due to the higher conductivity of the metal or metal alloy. One example of a via interconnection design and a fabrication process that belongs the second category is disclosed in the international patent application WO 2009/005462 A1. This design comprises a via hole having a constriction which provides a high yield, reliable, through-wafer via using processes compatible with conventional processing technologies in the field of microelectronics, MEMS and nanotechnology.

As mentioned above there is an ongoing miniaturisation trend, and thus, as components get smaller, vias has to become arranged more densely arranged in the substrate, and, as pad size becomes smaller, the precision in placement and lateral size of the vias has to be improved. Means for accomplishing this includes formation of high aspect ratio vias. Formation of a high aspect ratio vias of the second category is challenging not least due to the problems related to etching of the via hole and depositing of the conductive material. While being able to form narrow, high aspect ratio, via holes with high precision in placement, such via holes can not readily be provided with a conductive material. Hence an effective diameter of the via hole, i.e. the widest part of the via hole, has to be increased, typically by forming a tapered via hole in order to expose sidewalls of the via hole for deposition of conductive material. This widening limits the precision in placement of vias with respect to a component on the front side of the substrate, since opening of the via hole at the front side has to be carefully controlled.

It is often desirable to form vias extending through layers of different materials and possibly one wants the via to end in a etch stop layer, i.e. the via hole formed should be closed in one end. For example it is often desirable to have a via extending from one side of the substrate to a pad arranged on a plurality of underlying layers made of different materials, such as silicon oxide and silicon nitride, on the other side of the substrate. Etching of the via hole using prior art technologies typically yields an insufficient or uncontrollable etching of the layers of different materials or said underlying layers due to the different etching rates. A similar problem occurs when etching through a substrate and ending in a layer of different material, such as a metal layer arranged on the substrate surface. Then an uncontrolled widening of the via hole at the interface to the layer of different material may occur. In particular, these are problems for high aspect ratio via holes.

SUMMARY OF THE INVENTION

In view of the foregoing one object of the invention is to improve the formation of via holes and vias, and thereby to provide via holes and via interconnections that are more reliable and that enable more efficient packaging of electrical devices.

Hence a method of forming a via hole from a lower side of a substrate for electronic devices towards an upper side of the substrate at least partly through the substrate is provided. The method of forming the via hole comprises the steps of etching a first and a second lengthwise portion of the via hole, whereby the first lengthwise portion and the second lengthwise portion substantially make up the via hole and a constriction is formed in the via hole. The constriction defines an aperture of the via hole that function as an etch mask in a subsequent step of opening the via hole by etching, preferably anisotropic etching.

The aperture defines a narrowing of the via hole when observed from the lower side. This narrowing can take different shapes. The via hole that partly is formed by the steps of etching may be funnel-shaped, for example with at least partly sloping walls of the first lengthwise portion and substantially vertical sidewalls of the second lengthwise portion. Alternatively the etching of the second lengthwise portion results in that the via hole widens out from the aperture, i.e. there is a necking in the via hole. Consequently, the aperture may be elongated along part of the length of the via hole or the aperture may be well defined at one point in the via hole.

A via hole wherein the via hole widens out from the aperture is preferably accomplished by isotropic etching, however not limited to this.

The opening is preferably performed using anisotropic etching, more preferably ion milling. Thereby the aperture efficiently defines an area to be opened, in particular when the via hole has a high aspect ratio.

The combination of isotropic etching in order to widen the via hole and the anisotropic etching in order to open the via hole is particularly advantageous when forming via holes through substrates comprising multilayers of different materials and via holes ending in etch stop layers of different materials, such as metals due to controlled etching and high precision.

The via hole is during processing open to the lower side of the substrate and can be opened either to free air or to a pad, an etch stop layer, or any other layer or component integrated in, or mounted on, the substrate.

A method of forming a via at least partly through a substrate from a lower side of the substrate towards an upper side of the substrate is also provided. The method comprises the steps of forming a via hole in accordance with the invention and subsequently at least partially filling the via hole with a conductive material in order to provide a conductive path through the via hole.

A substrate for electrical devices comprising a via hole from a lower side of a substrate towards an upper side of the substrate at least partly through the substrate is provided. The substrate comprises a multilayer structure with individual layers of two or more different materials formed at the upper side of the substrate. The via hole extends through the multilayer structure and it is at least partly filled with a conductive material in order to provide a conductive path through the via hole, thereby forming a via. A constriction in the via hole defines an aperture of the via hole. The via hole widens out from the aperture towards the upper side and into the multilayer structure and opens up to free air or to a pad, an etch stop layer, or any other layer or component integrated in the substrate, with a width essentially corresponding to a width of the aperture.

Further, a substrate comprising a hermetically sealed cavity and a method of forming such is provided. The hermetically sealed cavity comprises at least one via in accordance with the invention, the via providing an electrical connection between the hermetically sealed cavity and a lower side of a substrate. The substrate may comprise two or more wafers, with cavities formed between each of the wafers. Such a hermetically sealed cavity can be used for packaging. The via hole is opened to a conductive trace extending into the cavity or a pad placed in the via.

In one embodiment of the invention a cross section of the via hole perpendicular to a longitudinal axis of the via hole is elongated, preferably rectangular, which provides further controlled conditions for the opening.

Thanks to the invention it is possible to provide a precise and reliable contacting of components or pads on one side of a substrate from the opposite side of the substrate.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIG. 7 schematically illustrates a hermetically sealed cavity according to the invention, and FIG. 8 schematically illustrates a via hole with a rectangular shape according to the invention.

DETAILED DESCRIPTION OF EMBODIMENTS

Figure 1:
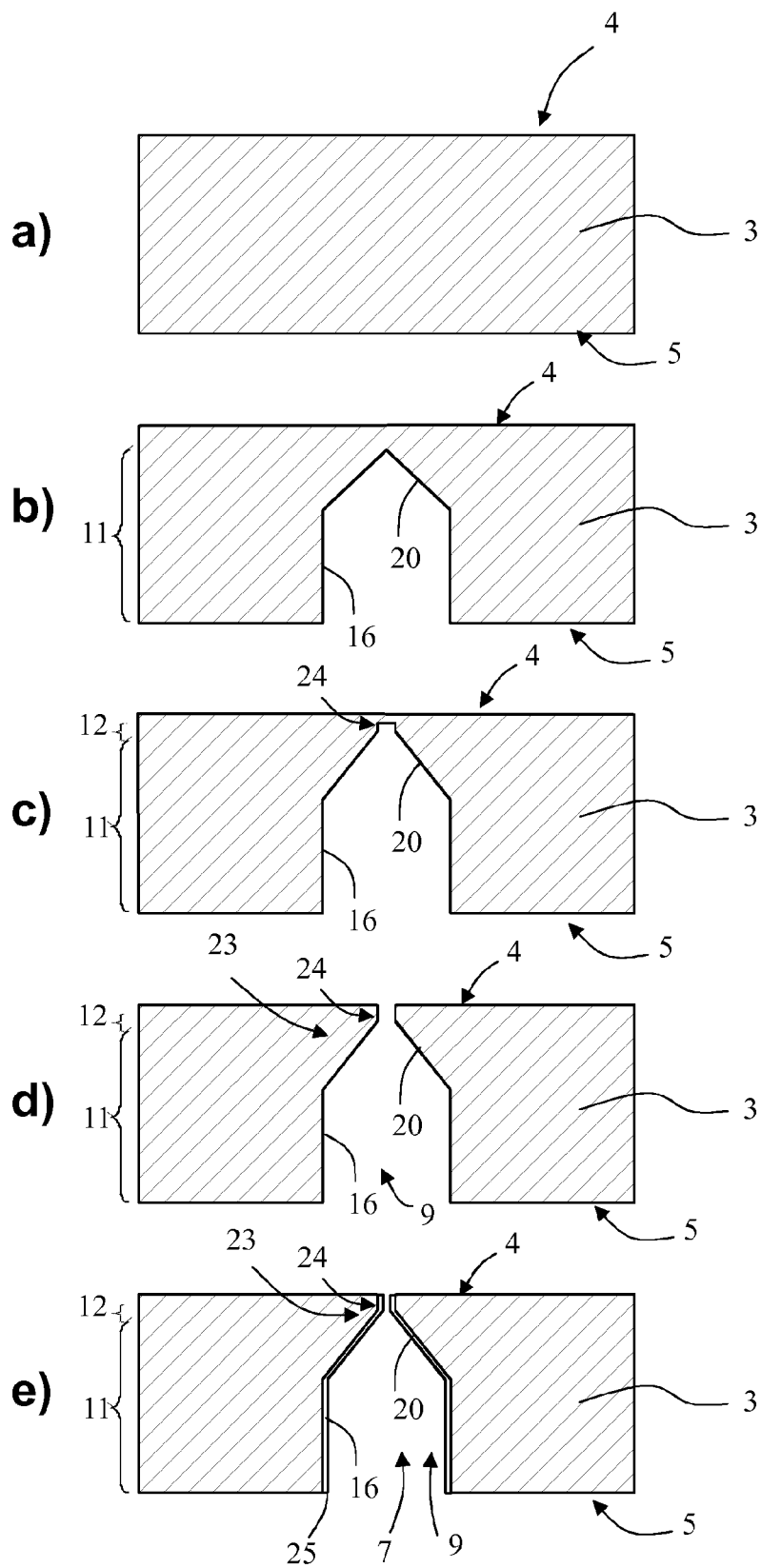
FIGS. 1a-e is a schematic illustration of steps of forming a via according to the invention.
Figure 2:
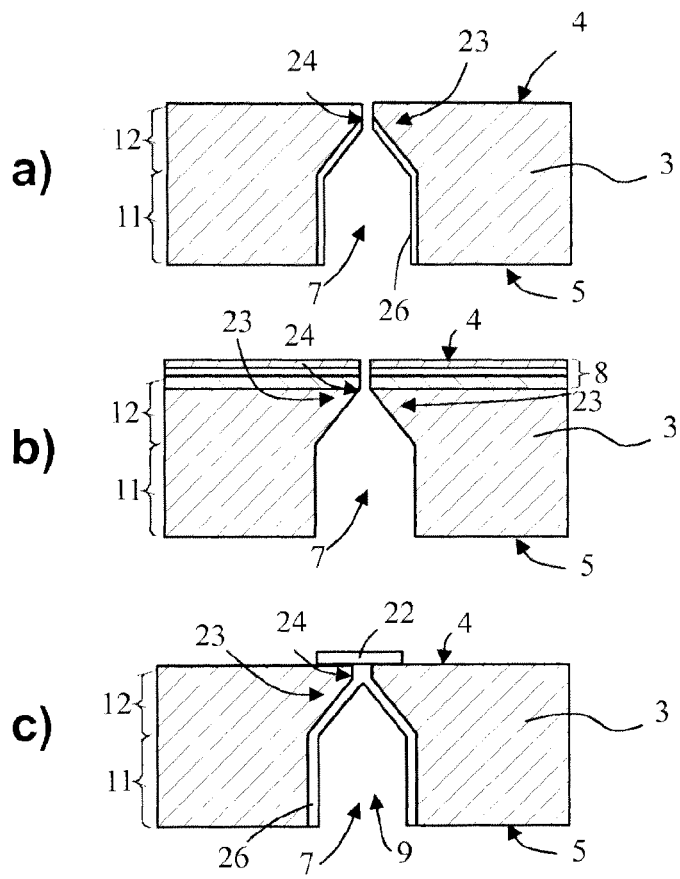
FIG. 2 is a schematic illustration of (a, b) via holes and (c) a via according to the invention.

For the purpose of this application the term "substrate" is intended to refer to what is commonly referred to as a wafer in the fields of electronics, microelectronics and MEMS. The substrate preferably comprises a crystalline semiconductor material such as crystalline silicon. It should be clear, however, that this implies no limitation, since, more generally, $Si_xGe_{1-x}$ with $0 \leq x \leq 1$, or any other material that commonly is used for these purposes, can be used. The substrate may be single crystalline, or it may comprise two or more layers stacked on each other. These layers may all be made of semiconductor materials, but one or more layers may also be made of insulator materials, dielectric materials, metals or metal alloys, and they may have been included in the substrate by deposition, growth, bonding or a combination thereof. For example it may be a so called silicon-on-insulator (SOT) substrate. One or more layers may have a limited lateral extension, e.g. forming a pad or a routing. Further, pads and/or components may have been included in the substrate, or in the surface thereof.

Referring to FIGS. 1-6, a method of forming a via hole 9 from a lower side 5 of a substrate 3 towards an upper side 4 of a substrate 3 at least partly through the substrate 3 comprises the steps of:

etching a first lengthwise portion 11 of the via hole 9; and etching a second lengthwise portion 12 of the via hole 9;

whereby the first lengthwise portion 11 and the second lengthwise portion 12 together substantially form the via hole 9. In other words, the etching is continued until only a minor part of the substrate 3 to be etched to form the via hole 9 is left. Due to the etching of the first and the second lengthwise portion 11, 12 a constriction 23 that defines an aperture 24 of the via hole 9 is formed. Thereafter the via hole 9 is opened by etching, with the constriction 23 functioning as an etch mask, i.e. the minor part of the substrate that was left is etched away.

When the via hole is formed the processing may be continued to form a via interconnection, hereinafter simply referred to as via, by at least partially filling the via hole 9 with a conductive material 25 in order to provide a conductive path through the via hole 9.

As appreciated from the above the via hole, or the via, may extend through the substrate 3 or only partly through the substrate 3. By way of example, the via hole, or the via, may connect the lower side 5 of the substrate 3 with for example a pad, a component, or a conductive layer at the upper side 4 of the substrate 3.

The filling is preferably made by depositing a conductive material 25 on the sidewalls of the via hole 9. This can be made using for example physical vapour deposition (PVD) process or chemical vapour deposition (CVD), atomic layer deposition, however not limited to these processes, on at least the sidewalls of the via hole. This will however only give a limited thickness of the conductive material. Electroplating and/or electroless plating can also be used, alone or in combination with for example PVD or CVD. Plating enable enhanced thickness of the conductive layer.

Figure 5:
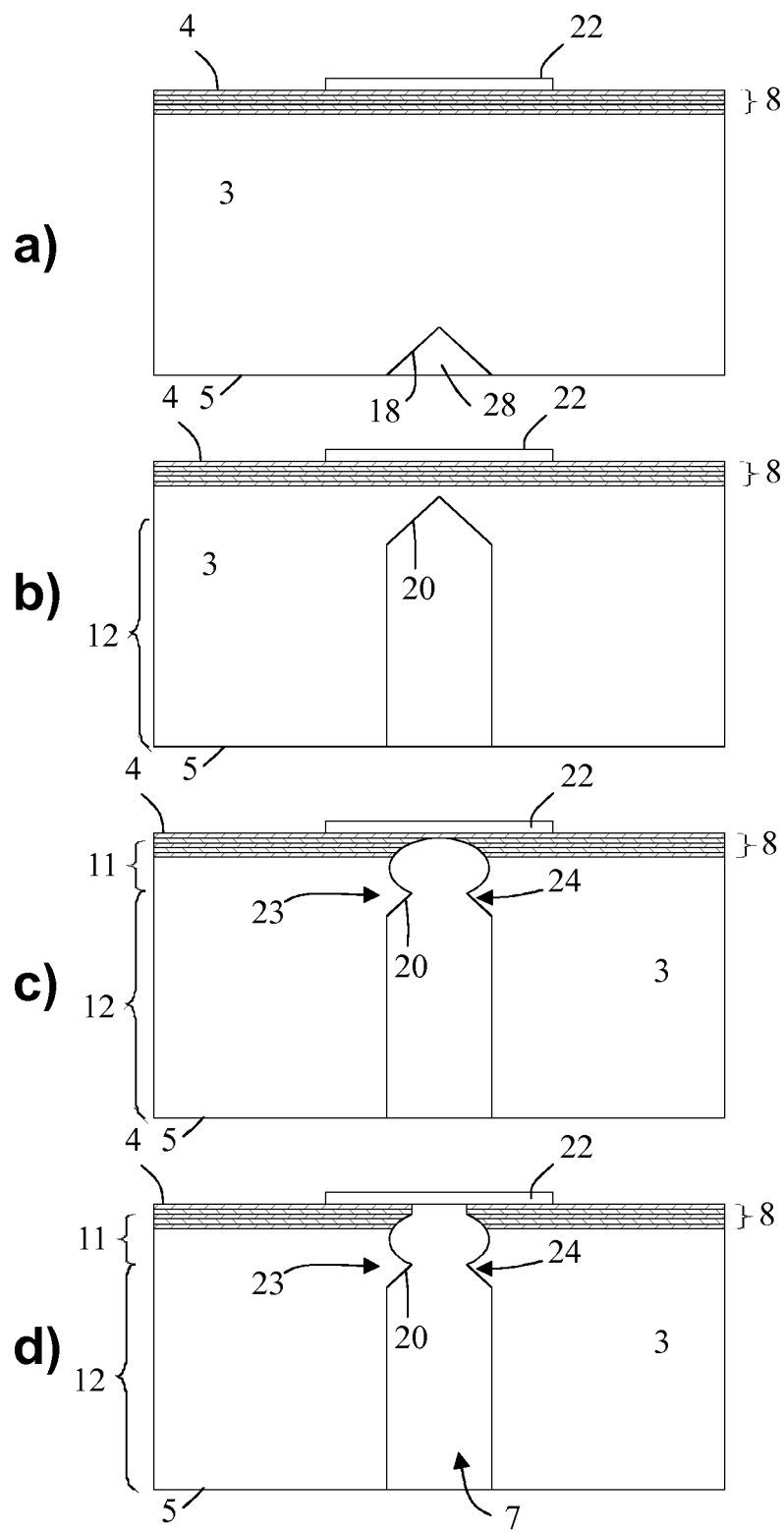
FIG. 5 schematically illustrates formation of a via hole in a substrate having a plurality of layers of different material according to the invention.
Figure 6:
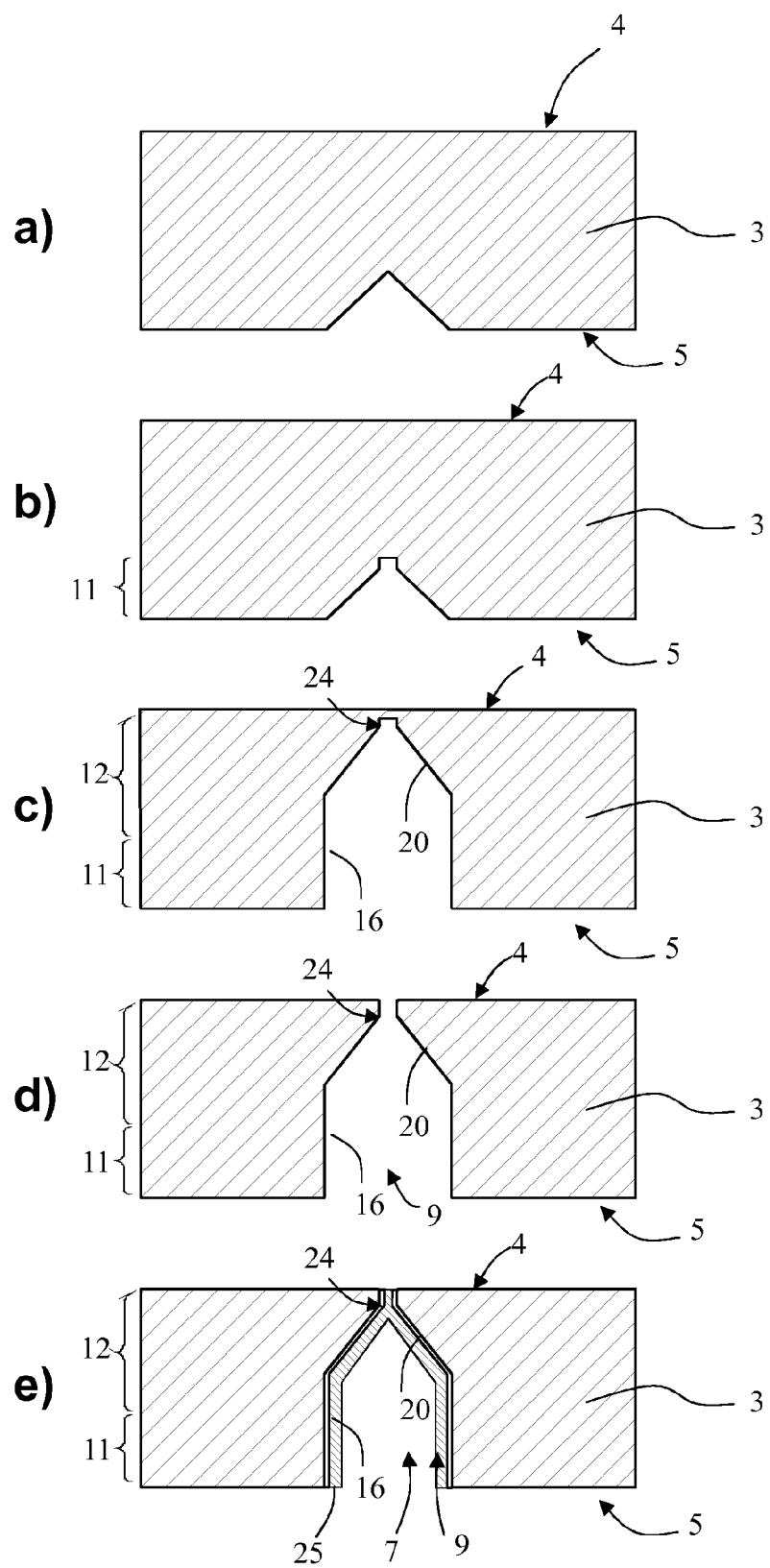
FIG. 6 schematically illustrates steps of forming a via according to the invention.

Anisotropic etching, such as dry etching, in particular deep reactive ion etching (DRIE), is preferably used in at least some of the steps of the method. DRIE is suitable for forming a high aspect ratio via hole that allows the formation of a fine pitch via array. Different anisotropic etching methods, including dry etching and wet etching, can be used in combination or anisotropic etching can be combined with isotropic etching in order to form different geometries of the via hole, as schematically illustrated in FIG. 1, FIG. 5 and FIG. 6. By way of example, a recess with a specific geometry can first be formed in a lower surface of the substrate 3 by anisotropic wet etching such as KOH etching. Then DRIE is used for continued etching of the recess, whereby a deeper recess with the specific geometry preserved in the bottom is formed.

Preferably the via hole is opened using anisotropic etching. In particular this is advantageous when narrow, high aspect ratio, via holes are opened.

FIG. 1 schematically illustrates formation of a via 7 through a substrate 3 in accordance with one embodiment of the present invention. In a) the substrate 3 before etching is shown. In b) a first lengthwise portion 11 is etched from a lower side of the substrate 3, whereby a recess with a substantially vertical sidewall 16, however not limited to this, and a lower sloping sidewall 20 is formed. As appreciated by a person skilled in the art, this step typically involves some kind of masking, such as a photolithographic process, in order to define the position of the via hole. In c) a second lengthwise portion 12 is formed by, however not limited to, anisotropic etching. A constriction 23 is defined by the lower sloping sidewall 20 and sidewalls of the second lengthwise portion 12. An aperture 24 of the via hole is defined by the sidewalls of the second lengthwise portion 12. In d) the via hole 9 is opened by etching a remaining part of the substrate 3, whereby a connection between the lower side 5 and the upper side 4 is established. In e) a via that provides a conductive path from the lower side 5 to the upper side 4 is obtained by forming a conductive layer 26 on the sidewalls of the via hole 9.

The method of forming the via hole 9 may further comprise the step of masking at least a portion of the sidewalls of the via hole 9, optionally including a photolithographic process, before opening the via hole 9. The masking makes it possible to apply an etch to open the via hole only in a predetermined area.

FIG. 2a schematically illustrates a via hole 9 opened using a mask 26 that has been formed on the sidewalls of the via hole 9. For example the mask 26 may be deposited on the whole sidewall of the partly formed via hole and then lithographically patterned to only open the via hole in the bottom of the partly formed via hole.

As mentioned above the substrate may comprise one or more layers stacked onto each other, thereby forming a multilayer structure. In FIG. 2b a via hole has been formed through a multilayer structure 8 in a surface region of the upper side 4 of the substrate 3. The via hole 9 is not necessarily opened to free air, but also the via hole, or the via, can end in a structure integrated in the substrate 3, such as a component, an etch stop layer or the like, or, as schematically illustrated in FIG. 2c, in a pad 22 arranged on the upper side 4 of the substrate 3. Ion milling is a process where a substrate to be etched is exposed to a bombardment of ions or other charged particles. These particles impinge on the substrate and physically erode the substrate. This can be used for etching the substrate material, a mask material and the like. The ion milling is directional, i.e. anisotropic, and has no chemical component. This increases the ability to achieve an anisotropic etch in the bottom of the via hole 9, in particular with the constriction 23 as etch mask. Ion milling can also be combined with chemical etching to increase the etch rate or to improve the etch properties. This can be done using a reactive gas instead of using vacuum/inert gas. However, it is still the ion bombardment that "etch" the substrate. Ion milling according to the invention can provide an aspect ratio of up to 1:10 and more. Ion milling is preferably used in the step of opening according to the invention. Since the incident angle of the ions are different in different parts of the partly formed via hole the sidewalls are not uniformly etched. The etch rate of a sidewall facing the impinging ions is much higher than for a vertical sidewall or a sloping sidewall. The etching can also be restricted to certain areas by masking the sidewalls of the partly formed via hole, as in FIG. 2a. Due to the highly directional impingement of the ions the via hole 9 is opened by an anisotropic etching and the size of the opening is efficiently controlled by the aperture 24. This highly directional impingement of ions is particularly important when opening a via hole 9 through a multilayer structure comprising layers having different etching properties, as in the structure of FIG. 2b, or when opening the via hole 9 to a etch stop layer, a pad 22 as illustrated in FIG. 2c, or the like. When using reactive ion etching in those situations, undesired lateral etching may be detrimental. With ion milling a controlled and reliable etching can be accomplished by simple means.

Figure 3:
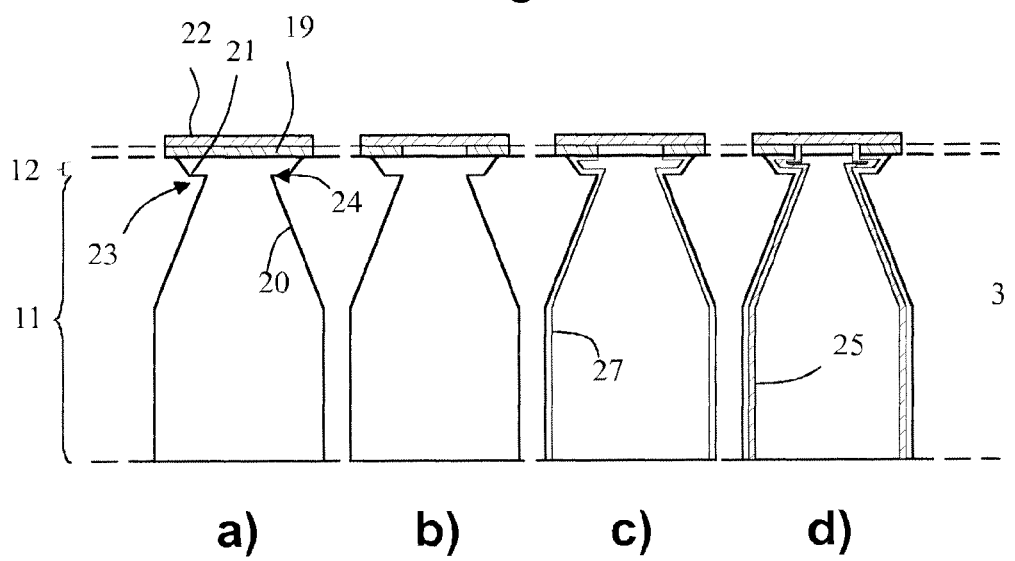
FIG. 3 schematically illustrates steps (a)-(d) of forming a via extending through an underlying layer to a pad according to the invention.

FIG. 3 schematically illustrates steps a)-d) in formation of a via 7 from a lower side 5 to a pad 22, such as a metal pad, having an underlying layer 19, such as a silicon oxide layer on an upper side 4 of a substrate 3, such as a single crystalline silicon substrate 3 in accordance with one embodiment of the invention. The underlying layer 19 is preferably used as an etch stop layer in this process, however not limited to this. In a) first lengthwise portion 11 and a second lengthwise portion 12 of the via hole 9 is formed. The first lengthwise portion 11 may extend all the way to the underlying layer 19, or preferably, as illustrated, the first lengthwise portion 11 stops at a position at a predetermined distance from the underlying layer 11. The etching of the second lengthwise portion results in that the via hole 9 intentionally widens out from an aperture 24 towards the upper side 4, whereby a constriction 23 is formed, defined by a lower sloping wall 20 of the first lengthwise portion 11 and an upper sloping wall 21 of the second lengthwise portion, with the aperture 24 at the intersection between said sloping walls 20,21. In b) the underlying layer 19 is etched to open the via hole 9 and to expose the pad 22, with the constriction 23 functioning as etch mask. Preferably, anisotropic etching is used. By way of example reactive ion etching, or preferably ion milling can be used. Optionally the sidewalls of via hole 9 are covered with a thin film 27 such an insulating layer, as shown in c). Such a thin film may temporarily be used as a protective film during further processing or, as in this embodiment, the thin film provides a permanent insulating layer on the sidewalls. In this step the constriction can again be used as an etch mask when removing any excessive insulating layer deposited on the pad 22 (not shown). Finally, as illustrated in e) a conductive material is formed on the sidewalls of the via hole 9 in order to form a conductive path from the lower side 5 to the pad 22. This can for example be made using electroless deposition. Optionally the constriction 23 is again used as an etch mask for removing any excessive conductive material deposited on the pad 22. The widening of a via hole 9 according to this embodiment may be referred to as notching.

Figure 4A:
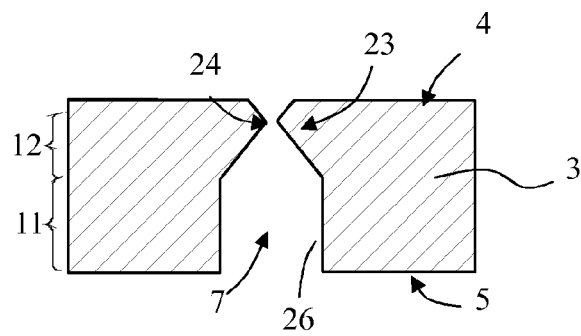
FIG. 4 schematically illustrates formation of in (a) a via hole that widens out from the aperture, in (b) a via hole through a substrate, and in (c) a via hole through a multilayer structure according to the invention.
Figure 4B:
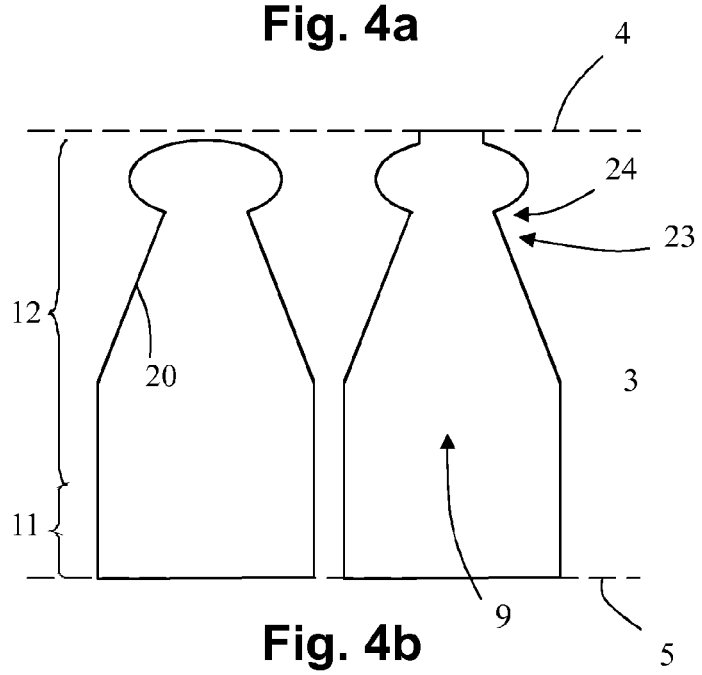

FIG. 4a schematically illustrates a via hole that widens out from the aperture. The shape of this portion of the via hole is dependent of the type of etching and processing parameters. Notching of the via hole in the step of etching the second lengthwise portion 12 can be obtained by isotropic etching. FIG. 4 schematically illustrates in (b) a via hole 9 before opening and in (c) after opening of the via hole 9. A first lengthwise portion 11 has been etched, whereby a lower sloping wall 20 is formed, and due to isotropic etching in the step of etching the second lengthwise portion 12 the via hole 9 widens out towards the upper side 4 and forms a cavity approaching the upper side 4 of the substrate 3. The lower sloping wall 20 and part of the isotropically etched cavity forms a constriction 23 and thereby an aperture 24 for etching. The via hole 9 is opened using anisotropic etching, preferably ion milling, with the constriction 23 functioning as etch mask.

Figure 4C:
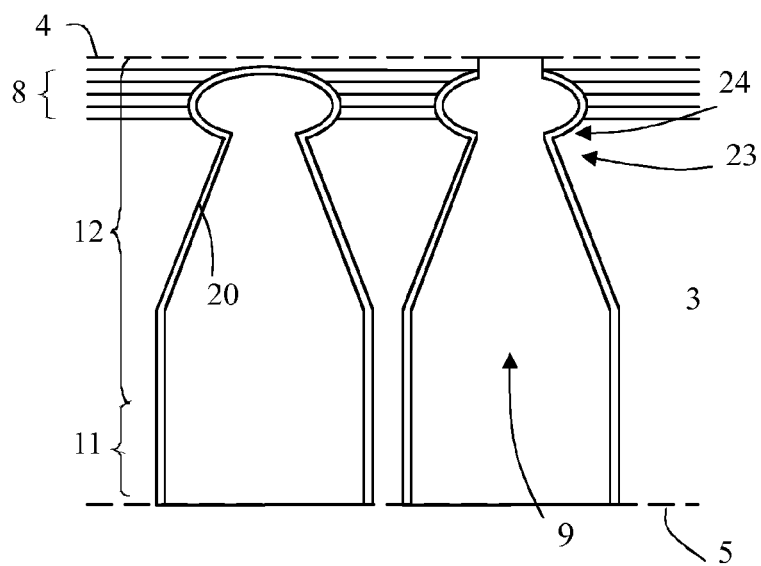

FIG. 4c schematically illustrates a via hole extending through a substrate comprising a plurality of layers made of different materials, i.e. a multilayer structure 8, at the upper side 4 of the substrate 3. In similarity with the process described with reference to FIG. 4a, isotropic etching is used to at least partly etch through the multilayer structure 8. Optionally a masking layer, which preferably is made of an insulator material, is deposited on the sidewalls of the partly formed via hole before opening the via hole 9 in order to protect the multilayer structure 8. By using an anisotropic etch process such as ion milling a well defined opening can be provided. Different etch properties of the different layers is thereby not a problem. The multilayer structure 8 is typically less than 5 μm thick in total. Each layer may have a thickness of 0.01-1 μm, but commonly 10-300 nm. Since the thickness of the substrate and hence the via hole depth can be 50-1000 μm, but is typically 100-700 μm, and the maximum diameter is less than 500 μm, typically in the range of 80-200 μm, but may be as small as about 20 μm with an aperture width of about 1-50 μm, preferably 5-30 μm, it is appreciated that FIG. 4a is not to scale, but for example the thickness of the multilayer structure and the notched portion is exaggerated.

Although ion milling has been disclosed as the preferred alternative other directional etches can be use, alone or in combination with the ion milling. For example the ion milling can be combined with dry etching methods.

As appreciated from the above description the method provides a via 7 having a constriction 23 that in the manufacturing of the via can be used as an etch mask. In addition, in use the constriction 23 provides an improved adhesion of the conductive material and gives a mechanical support to the conductive material, which improves the robustness and the reliability of the via 7. The international patent application WO 2009/005462 A1 further describes a method for forming via holes having constrictions and the benefit of using such via holes for vias.

Although, dry etching like Deep Reactive Ion Etching (DRIE) often is preferred, wet etching can also be used. It is also possible to use a combination of wet and dry etching. For example, the wet etch may be used to create a v-shaped recess, that is maintained in the bottom of the partly formed via hole while subsequently dry etching the substrate. An example of such a partly formed via hole is illustrated in FIG. 5b, showing the via hole with a first portion of the via hole with a substantially vertical sidewall, and a second portion of the via hole with sloping walls, replicating sloping walls of the wet etched recess. As appreciated by a person skilled in the art sloping walls can also be obtained by DRIE.

In one embodiment of the invention the step of etching the first lengthwise portion of the via hole comprises the steps of:
  as schematically illustrated in FIG. 5a, forming a recess 28 with sloping sidewalls 18 in the lower side 5 of the substrate 3; and
  as, schematically illustrated in FIG. 5b, forming lower sloping walls 20 of the constriction 23 by anisotropic etching, the lower sloping walls 20 being replicas of the sloping walls 18 of the recess 28 and the first lengthwise portion 11, whereby substantially vertical sidewalls are formed between the lower sloping walls 20 and the lower side 5.

The etching of the sloping walls 18 is preferably made using wet etching, however dry etching such as DRIE can also be used by adapting the process to form sloping walls.

By way of example, FIG. 5 schematically illustrates formation of a via hole in a substrate comprising a multilayer structure 8 in a surface region in the upper side 4 of the substrate 3 and a pad 22 arranged on the multilayer structure 8. After etching the first lengthwise portion 11 the etching is continued by isotropic etching of a second lengthwise region 12, whereby a constriction 23 is formed and the multilayer structure 8 at least partly is etched. The via hole 9 is opened through the remaining part of the multilayer structure 8 to the pad 22 using a anisotropic etch, with the constriction 23 functioning as an etch mask.

If having a substrate with some kind of stop layer on the front side of the substrate, the etch will finally encounter this stop layer and the etch rate of the encountered layers will be significantly lower than the etch rate of the substrate if the materials are chosen properly. If, by way of example a combination of a wet etching method and a dry etching method is used, it is possible to obtain a via hole with a small opening at the upper side, and vertical sidewalls extending from the lower side 5, wherein the small opening and the vertical sidewalls are connected by sloped sidewalls partly forming the constriction 23.

As mentioned above an end portion of the via hole may be masked using photolithography. This is possible when the via hole is wide enough for a light sensitive mask material like photoresist to reach the bottom of the via hole, and the sloped sidewalls of the bottom portion of the via hole enables high definition patterning of the mask material within the via hole. To further increase the process control, that is, thickness, uniformity and the ability of the mask material to reach the bottom of the trench, a spray method may be used. This method has advantages over other deposition methods in that it offers an even distribution of the sprayed material over irregular and structured surfaces. In addition, it is very easy to apply and makes it possible to apply very thin layers with accurate thickness control.

In one embodiment of the invention, a layer on the upper side 4 of the substrate 3, forming the bottom of a partly formed via hole, is a metal. By using an ion milling method, which can be for example ion beam etching (IBE), focused ion beam (FIB), reactive ion etching (RIE) or reactive ion beam etching (RIBE), the directionality of the method makes it possible to etch a patterned structure in the bottom of the partly formed via hole. The method can for example be used to etch through the first two layers on the back side of the substrate, through the via hole, and stop on the metal. By filling the via hole, or at least cover the side walls of the via hole, with a conducting material, such as a metallic material, for example Ti, TiW, Cu, Al or any other in the IC-industry commonly used conducting material, a conductive path from the lower side to the upper side of the substrate may be accomplished, i.e. a via 7. The metal on the upper side of the substrate may be part of a device or a structure, which thus can be electrically contacted from underneath the structure through the via. The device or structure may comprise a plurality of terminals, where each and every terminal is contacted from underneath the structure through a respective via.

One implementation of the present invention, representing a method of forming a hermetically sealed cavity 30 with a via 7, the via 7 providing an electrical connection between the sealed cavity 30 and a lower side 5 of the substrate 3 is schematically illustrated in FIGS. 7a-d. As illustrated, the hermetically sealed via may be formed between two wafers. Such a hermetically sealed cavity can be used for packaging. FIGS. 7a-e schematically illustrate examples of different shapes of the via hole in accordance with the invention. Optionally an insulating layer or one or more additional layers, such as an additional conductive layer may be added in a radial configuration with the conductive layer of the via 7 (not shown). The hermetically sealed cavity 30 can be formed by, for example, etching a cavity in one of the wafers, forming a conducting trace 31 and/or a pad 22 on at least one of the wafers, the conducting trace 31 and/or pad 22 intended to extend at least partly into the cavity, sealing the cavity by bonding the wafers or by other means joining the wafers. The electrical connection is provided by using the method of forming a via hole 7 and a via 9 according to the invention. The via hole is opened to the conductive trace before depositing a conductive material that contacts the conductive trace and forms the electrical connection from the lower side 5 to the cavity. In an alternative embodiment the via hole is opened to a pad placed directly in the cavity.

Referring to FIG. 7e, as described above the via hole 9 is opened using the constriction as etch mask, i.e. the diameter of the hole that is opened is defined by the aperture size. However, the diameter of the opened hole may differ from the diameter of the aperture. In FIG. 7e, the diameter of the opened hole is defined by the upper sloping walls of the constriction.

In one embodiment of the invention the via hole 9 through the substrate 3 in accordance with the invention, when observed from the upper side (4) or the lower side (5), is elongated, e.g. rectangular, i.e. a lateral cross section is elongated. FIG. 8 schematically illustrate a top view and two cross sectional views along the lines A-A and B-B of the through wafer via hole 9. Preferably the width-to-length ratio is at least 1:1.5, more preferably in the range of 1:2 to 1:10. By using this kind of through wafer via holes the etch rate can be improved and further the opening of the via hole can be improved.

Using the methods of the invention, it is possible to etch structures in small via holes, which have a maximum diameter of less than 500 μm, typically in the range of 80-200 μm, but may be as small as about 20 μm, in a thick substrate. The thickness of the substrate and hence the via hole depth can be 50-1000 μm, but is typically 100-700 μm. Further, the aperture width is about 1-50 μm, preferably 5-30 μm.

All references to upper, lower, lengthwise, bottom etc are introduced for the easy of understanding only, and should not be considered as limiting to specific orientation. Typically wafers are used as substrates. These wafers have two principal surfaces, which both can be used for components, routing, assembly, etc. Lengthwise refers to a direction parallel to a direction perpendicular to such a principal surface. Further the dimensions of the structures in the drawings are not necessarily to scale.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A method of forming a lengthwise-extending via hole from a lower side of a substrate for electronic devices towards a via hole opening in an upper side of the substrate at least partly through the substrate, the substrate comprising a multilayer structure comprising individual layers of two or more different materials formed at the upper side of the substrate, the method comprising the steps of:

etching a first lengthwise portion of the via hole, wherein the first lengthwise portion extends from the lower side of the substrate towards the upper side of the substrate, the first lengthwise portion comprising a vertical sidewall followed in a lengthwise direction by a tapering sidewall that tapers to form a constriction in the via hole, wherein the constriction has a minimum transverse size and a transverse shape and is disposed above the lower side of the substrate and beneath the multilayer structure;

etching a second lengthwise portion of the via hole from the constriction towards the upper side of the substrate; and opening up the via hole to the upper side of the substrate to form an opening of the via hole in the upper side of the substrate by etching, such that the second lengthwise portion widens out transversely at a location beneath the multilayer structure as the second lengthwise portion extends from the constriction in the lengthwise direction towards the upper side of the substrate before narrowing again, wherein the opening of the via hole has a transverse size and a transverse shape corresponding to the transverse size and the transverse shape of the constriction.

2. The method according to claim 1, wherein the step of etching the second lengthwise portion of the via hole comprises isotropic etching.

3. The method according to claim 1, wherein the step of opening up the via hole to the upper side of the substrate comprises anisotropic etching.

4. The method according to claim 3, wherein the anisotropic etching comprises ion milling, wherein a fraction of ions or other charged particles incident on the substrate pass through the constriction and contribute to the anisotropic etching.

5. The method according to claim 1, wherein the step of etching the second lengthwise portion of the via hole comprises isotropic etching of the multilayer structure.

6. The method according to claim 5, wherein the step of opening the via hole comprises anisotropic etching of the multilayer structure.

7. The method according to claim 5, further comprising the step of covering at least sidewalls of the via hole with a thin film prior to the step of opening the via hole.

8. The method according to claim 1, wherein the substrate comprises an etch stop layer, the step of etching the second lengthwise portion in a longitudinal direction is stopped by the etch stop layer, and the step of opening the via hole comprises etching of the etch stop layer.

9. The method according to claim 1, wherein the step of etching the first lengthwise portion of the via hole comprises the steps of:
- forming a recess with tapering sidewalls in the lower side of the substrate; and
- forming tapering sidewalls of the constriction by anisotropic etching of the recess,
- wherein substantially vertical sidewalls are formed between the tapering sidewalls and the lower side of the substrate.

10. The method according to claim 1, wherein a cross section of the via hole, when observed from the upper side of the substrate or the lower side of the substrate, is elongated.

11. A method of forming a via at least partly through a substrate from a lower side of the substrate towards an upper side of the substrate comprising the steps of:
- forming a via hole according to claim 1; and
- at least partially filling the via hole with a conductive material in order to provide a conductive path through the via hole.

12. A method of forming a hermetically sealed cavity comprising the method of forming the via according to claim 11, wherein the via provides an electrical connection between the hermetically sealed cavity and a lower side of the substrate, and wherein the via is opened to a conductive trace or a pad that is placed at least partly within the cavity, wherein an electrical connection is formed from the lower side of the substrate to the hermetically sealed cavity.

13. The method according to claim 1, wherein the cross section of the via hole, when observed from the upper side of the substrate or the lower side of the substrate, is rectangular.

14. The method according to claim 1, wherein the opening of the via hole is disposed at at least a top layer of the multilayer structure in the upper direction.

15. A substrate for electrical devices, the substrate having a lower side and an upper side, and a via hole extending from the lower side of the substrate towards the upper side of the substrate, wherein:
- the substrate comprises a multilayer structure comprising individual layers of two or more different materials formed at the upper side of the substrate;
- the via hole extends through the multilayer structure;
- the via hole is at least partly filled with a conductive material in order to provide a conductive path through the via hole, thereby forming a via interconnection; and wherein:
- the via hole comprises a first lengthwise portion, extending from the lower side of the substrate towards the upper side of the substrate, the first lengthwise portion having a substantially vertical sidewall followed by a tapering sidewall that tapers to form a constriction in the via hole, wherein the constriction has a minimum transverse size and a transverse shape and is disposed between the lower side of the substrate and the multilayer structure, the substantially vertical sidewall extending from the lower side of the substrate to the tapering sidewall;
- the via hole widens out from the constriction at a location beneath the multilayer structure as the via hole extends towards the upper side of the substrate and into the multilayer structure and then narrows again as the via hole approaches the upper side of the substrate; and
- the via hole opens up in the upper side of the substrate at an opening of the via hole having a size and a shape corresponding to the minimum transverse size and the transverse shape of the constriction.

16. The substrate according to claim 15, wherein a transverse cross section of the via hole, when observed from the upper side of the substrate or the lower side of the substrate, is rectangular.

17. The substrate according to claim 15, wherein the opening of the via hole is disposed at at least a top layer of the multilayer structure in the upper direction.

* * * * *